United States Patent
Wieners

(10) Patent No.: US 11,876,111 B2
(45) Date of Patent: Jan. 16, 2024

(54) SENSORS FOR SIMULTANEOUS PASSIVE IMAGING AND RANGE FINDING

(71) Applicant: Sensors Unlimited, Inc., Princeton, NJ (US)

(72) Inventor: John Angelo Wieners, Morrisville, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 217 days.

(21) Appl. No.: 17/205,192

(22) Filed: Mar. 18, 2021

(65) Prior Publication Data
US 2021/0225925 A1 Jul. 22, 2021

Related U.S. Application Data

(62) Division of application No. 16/156,392, filed on Oct. 10, 2018, now Pat. No. 10,985,203.

(51) Int. Cl.
| | |
|---|---|
| *H01L 27/146* | (2006.01) |
| *G01S 7/4863* | (2020.01) |
| *G01S 17/08* | (2006.01) |
| *H04N 5/33* | (2023.01) |
| *H04N 25/76* | (2023.01) |
| *G01S 7/4865* | (2020.01) |
| *H04N 23/45* | (2023.01) |

(52) U.S. Cl.
CPC ...... *H01L 27/14649* (2013.01); *G01S 7/4863* (2013.01); *G01S 17/08* (2013.01); *H01L 27/14634* (2013.01); *H01L 27/14643* (2013.01); *H04N 5/33* (2013.01); *H04N 25/76* (2023.01); *G01S 7/4865* (2013.01); *H04N 23/45* (2023.01)

(58) Field of Classification Search
None
See application file for complete search history.

(56) References Cited

U.S. PATENT DOCUMENTS

| | | | |
|---|---|---|---|
| 7,560,679 | B1 | 7/2009 | Gutierrez |
| 7,608,823 | B2 | 10/2009 | Tennant |
| 7,760,334 | B1 | 7/2010 | Evans |
| 8,107,057 | B2 | 1/2012 | Audier et al. |
| 8,139,141 | B2 | 3/2012 | Bamji et al. |
| 8,569,700 | B2 | 10/2013 | Bikumandla |
| 10,263,022 | B2 | 4/2019 | Wan et al. |
| 10,394,237 | B2 | 8/2019 | Xu et al. |
| 2001/0013898 | A1 | 8/2001 | Bawolek et al. |
| 2002/0024058 | A1 | 2/2002 | Marshall et al. |
| 2006/0221250 | A1 | 10/2006 | Rossbach et al. |
| 2007/0201859 | A1 | 8/2007 | Sarrat |

(Continued)

OTHER PUBLICATIONS

Extended European Search Report dated Mar. 17, 2020, issued during the prosecution of European Patent Application No. EP 19202559.1.

*Primary Examiner* — Grant S Withers
(74) *Attorney, Agent, or Firm* — Locke Lord LLP; Joshua L. Jones; Gabriella D'Angelo

(57) ABSTRACT

A sensor includes a sensor array. The sensor array includes a plurality of passive imaging pixels and a plurality of time of flight (TOF) imaging pixels. A method of imaging includes collecting passive imaging data from a sensor array and collecting time of flight (TOF) imaging data from the sensor array. Collecting passive imaging data and collecting TOF imaging data can be performed at least partially at the same time and along a single optical axis without parallax.

8 Claims, 2 Drawing Sheets

(56) References Cited

U.S. PATENT DOCUMENTS

| | | |
|---|---|---|
| 2008/0266431 A1 | 10/2008 | Ohyama et al. |
| 2011/0102547 A1 | 5/2011 | Sul et al. |
| 2012/0044093 A1 | 2/2012 | Pala |
| 2012/0056073 A1 | 3/2012 | Ahn |
| 2012/0056988 A1 | 3/2012 | Stanhill et al. |
| 2014/0138519 A1 | 5/2014 | Wang et al. |
| 2015/0001664 A1 | 1/2015 | Van Der Tempel et al. |
| 2016/0065870 A1 | 3/2016 | Pyeoun |
| 2016/0178749 A1 | 6/2016 | Lin et al. |
| 2016/0240579 A1 | 8/2016 | Sun et al. |
| 2016/0295133 A1 | 10/2016 | Rudmann et al. |
| 2016/0344965 A1 | 11/2016 | Grauer et al. |
| 2016/0373676 A1 | 12/2016 | Zhang et al. |
| 2017/0040362 A1 | 2/2017 | Na et al. |
| 2017/0146657 A1 | 5/2017 | Xu |
| 2017/0330909 A1 | 11/2017 | Wan et al. |
| 2018/0091746 A1 | 3/2018 | Benser et al. |
| 2018/0176487 A1 | 6/2018 | Price et al. |
| 2018/0233521 A1 | 8/2018 | Na et al. |
| 2018/0306926 A1 | 10/2018 | LaChapelle et al. |
| 2018/0308881 A1 | 10/2018 | Hynecek |
| 2018/0358391 A1 | 12/2018 | Itzler et al. |
| 2019/0191067 A1 | 6/2019 | Vaillant et al. |

SENSORS FOR SIMULTANEOUS PASSIVE IMAGING AND RANGE FINDING

CROSS-REFERENCE TO RELATED APPLICATION

This application is a divisional of U.S. patent application Ser. No. 16/156,392 filed Oct. 10, 2018 which is incorporated by reference herein in its entirety.

BACKGROUND OF THE INVENTION

1. Field of the Invention

The present disclosure relates to imaging, and more particularly to passive imaging and time of flight imaging such as for three-dimensional imaging devices.

2. Description of Related Art

In some imaging applications, passive imaging to provide value and/or color information about a scene and time of flight (TOF) depth sensing is also needed. For example, in a smart car application, the smart car may need information about how far away a sign is. A TOF sensor system can provide that information. But the smart car application may also need to know the content of the sign, which can be provided by a camera using passive imaging to take a picture of the sign. In conventional systems, the TOF and passive imaging each require a separate sensor. One solution to this has been to use an alternate type of depth sensing such as structured lighting.

The conventional techniques have been considered satisfactory for their intended purpose. However, there is an ever present need for improved TOF and passive imaging. This disclosure provides a solution for this need.

SUMMARY OF THE INVENTION

A sensor includes a sensor array. The sensor array includes a plurality of passive imaging pixels and a plurality of time of flight (TOF) imaging pixels.

The passive imaging pixels can be arranged in an alternating pattern with the TOF imaging pixels on the sensor array. The alternating pattern can include alternating columns of passive imaging pixels and columns of TOF imaging pixels across the sensor array. The passive imaging pixels and the TOF imaging pixels can be in a common layer of semiconductor in the sensor array. The passive imaging pixels can each include a PIN photodiode. The TOF imaging pixels can each include an avalanche photodiode. The passive imaging pixels and the TOF pixels can all be sensitive to SWIR illumination.

Each TOF imaging pixel can include a constant current source electrically connected to a first node. An integrating capacitor can be electrically connected between the first node and a ground. A sampling transistor can be electrically connected between the first node and a second node. A photodiode can be electrically connected between a base terminal of the sampling transistor and the ground for switching electrical connectivity through the sampling transistor in response to radiation incident on the photodiode. Each TOF pixel can be configured to generate a pixel value that represents the distance between that TOF pixel and a point in a field of view.

A sensor system includes a sensor array as described above and a read-out only integrated circuit (ROIC) operatively connected to the sensor array. The ROIC includes a respective ROIC pixel operatively connected to each passive imaging pixel to receive electrical signals indicative of imaging data from the passive imaging pixel. The ROIC also includes a respective ROIC pixel operatively connected to each TOF imaging pixel to receive electrical signals indicative of TOF from the TOF imaging pixel.

A support module can be operatively connected to the ROIC to receive passive imaging and TOF imaging data from the ROIC. The support module can be configured to output blended images including passive imaging data and TOF imaging data. The support module can be configured to separate passive imaging data and TOF imaging data from the ROIC and to output separate images for passive imaging and TOF imaging.

The system can include an illumination source and a controller operatively connected to the illumination source and the sensor array to initiate TOF imaging pixel integration and a pulse of illumination so the TOF imaging pixels output a signal indicative to time of flight (TOF) of the pulse of illumination. The controller can be configured to flash a scene with the illumination source and to collect passive imaging data from the passive imaging pixels while flashing the scene with the illumination source.

A method of imaging includes collecting passive imaging data from a sensor array and collecting time of flight (TOF) imaging data from the sensor array. Collecting passive imaging data and collecting TOF imaging data can be performed at least partially at the same time and along a single optical axis without parallax.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
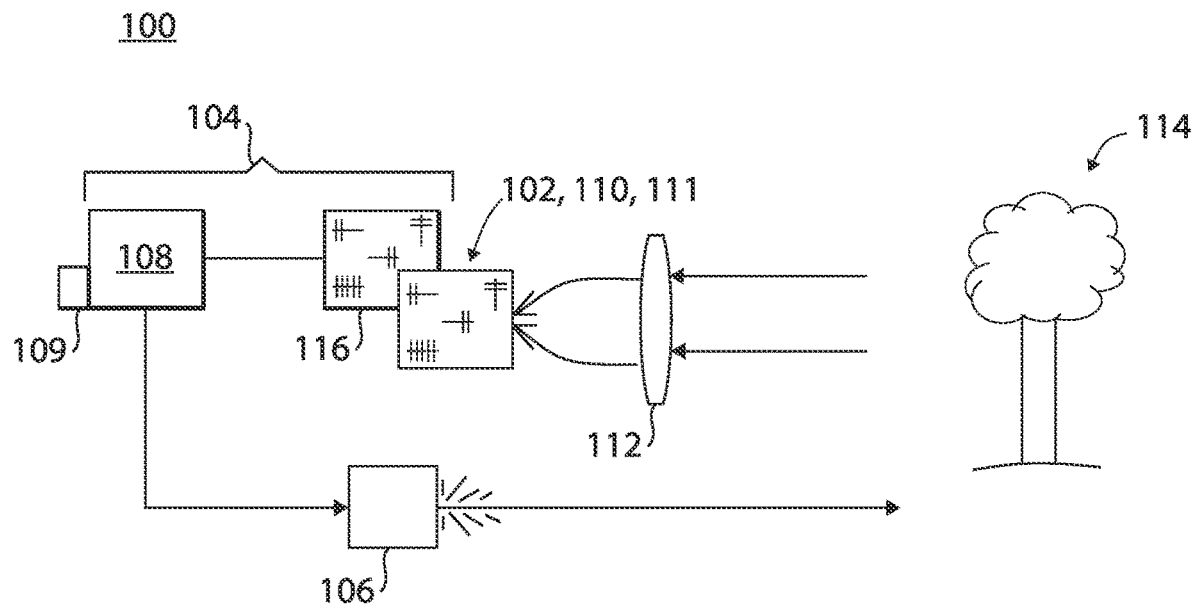
FIG. 1 is a schematic view of an exemplary embodiment of a system constructed in accordance with the present disclosure, showing the sensor array and supporting circuitry.

Reference will now be made to the drawings wherein like reference numerals identify similar structural features or aspects of the subject disclosure. For purposes of explanation and illustration, and not limitation, a partial view of an exemplary embodiment of a system in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to form TOF images, where each pixel value represents the distance between that pixel and a point in the field of view, and to form passive images, where each pixel value represents a color or value of a portion of the field of view, using a single sensor.

The sensor system 100, e.g. for a combined TOF and passive imaging camera, includes sensor with a sensor array 102 of sensor pixels, 110, 111. The system 100 includes supporting circuitry 104 operatively connected to the sensor array 102 to convert signals from the sensor pixels 110, 111 into image data.

Figure 3:
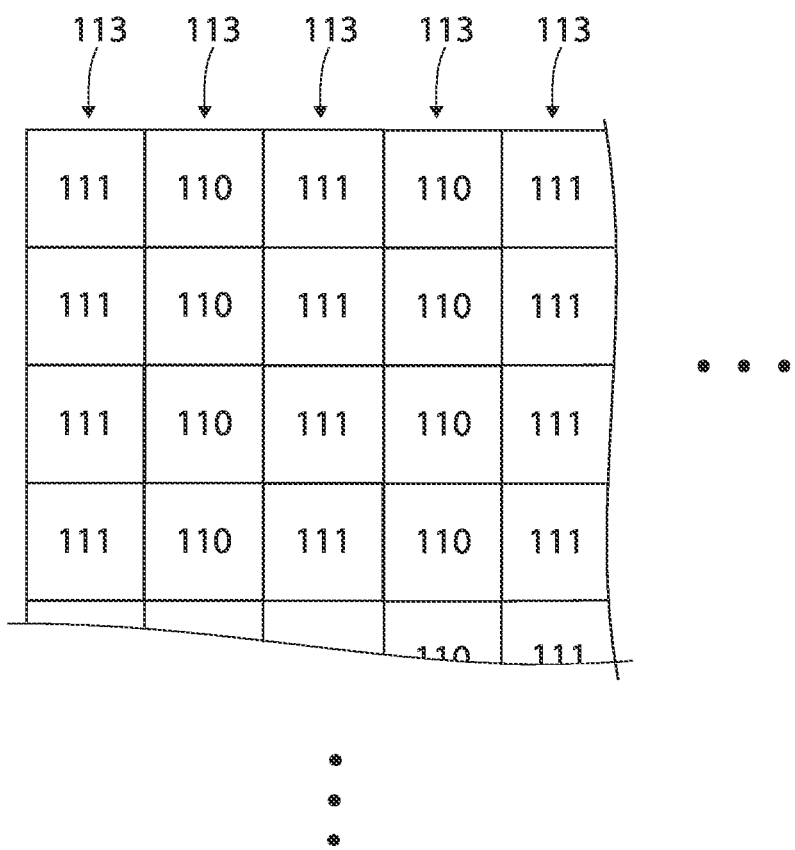
FIG. 3 is a schematic plan view of the sensor array of FIG. 1, showing the alternating pattern of passive imaging and TOF pixels.

With reference to FIG. 3, the sensor array 102 includes a plurality of passive imaging pixels 111 and a plurality of time of flight (TOF) imaging pixels 110. The passive imaging pixels 111 are arranged in an alternating pattern with the TOF imaging pixels 110 on the sensor array 102. The alternating pattern includes alternating columns 113 of passive imaging pixels 111 and columns of TOF imaging pixels 113 across the sensor array 102. Those skilled in the art will readily appreciate that any other suitable pattern can be used without departing from the scope of this disclosure. The ellipses directed to the right and downward in FIG. 3 indicate that any suitable number of pixels 111 and 110 can be included on the sensor array 102. The passive imaging pixels 111 and the TOF imaging pixels 110 are side by side in a common layer of semiconductor in the sensor array 102, as opposed to having the TOF imaging pixels 110 deeper within the sensor array under the passive imaging pixels 111, for example. The passive imaging pixels 111 can each include a PIN photodiode. The TOF imaging pixels 110 can each include an avalanche photodiode. The passive imaging pixels 111 and the TOF pixels 110 can all be sensitive to SWIR illumination, or any other suitable band or bands of illumination.

The system 100 includes an illumination source 106 and a controller 108 operatively connected to the illumination source 106 and to the sensor array 102 to initiate pixel integration and a pulse of illumination from the illumination source 106 so the TOF imaging pixels 110 can output a signal indicative of time of flight (TOF) of the pulse of illumination. Optics 112 are optically connected to the array 102 of sensor pixels 110 for focusing illumination, e.g., a return of the pulse of illumination from the illumination source 106, from a scene 114 onto the TOF imaging pixels 110. The optics 112 can also focus an image of the scene 114 onto the sensor array 112 for passive imaging by the passive imaging pixels 111. The supporting circuitry 104 includes the controller 108 and a read out only integrated circuit (ROIC) 116 that is operatively connected to the array 102 for data conditioning for output from the sensor pixels 110. The controller 108 can also be configured to flash the scene 114 with the illumination source 106 and to collect passive imaging data from the passive imaging pixels 111 while flashing the scene with the illumination source.

Figure 2:
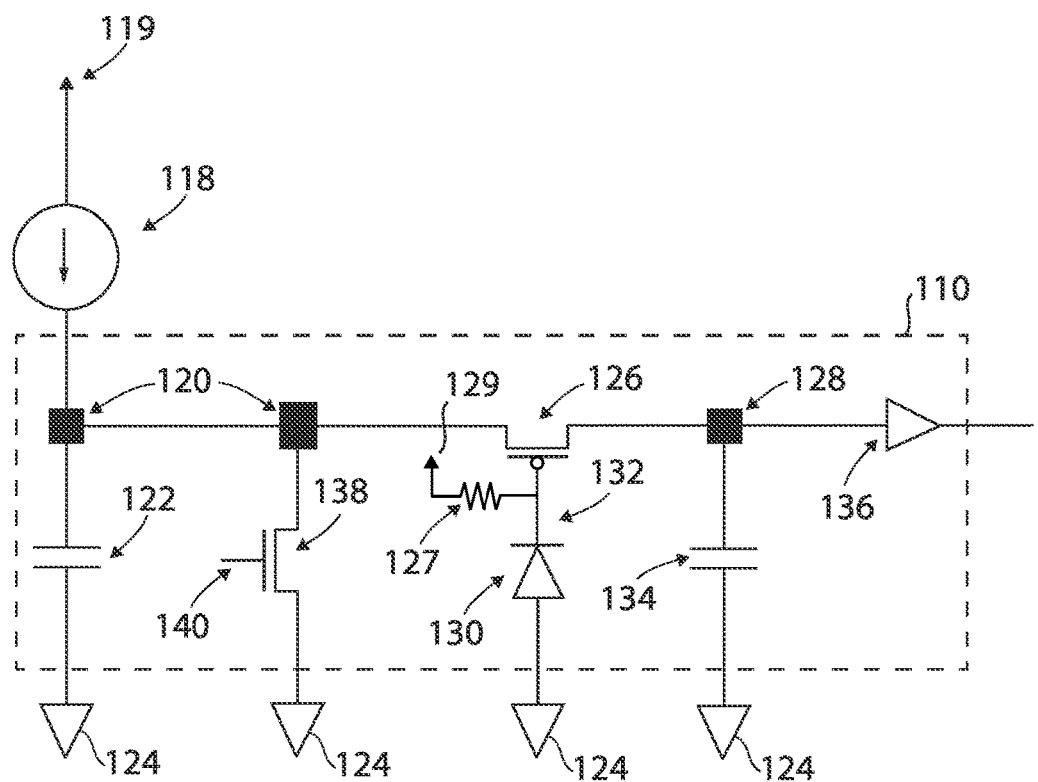
FIG. 2 is a schematic view of a portion of the system of FIG. 1, showing the circuit architecture of one of the time of flight (TOF) pixels.

With reference now to FIG. 2, a constant current source 118 electrically connects a power rail 119 to a first node 120 of each pixel 110. A single current source 118 can be shared by all of the pixels 110 in an array 102, or each column of pixels 110 can have its own current source 118 for example. An integrating capacitor 122 is electrically connected between the first node 120 and a ground 124, e.g. actual ground, a local ground such as a shared negative node, or the like. A sampling transistor 126, e.g., a pmos transistor, is electrically connected between the first node 120 and a second node 128. A photodiode 130, e.g., an avalanche photodiode, is electrically connected between a base terminal 132 of the sampling transistor 126 and the ground 124 for switching electrical connectivity of the first and second nodes 120, 128 through the sampling transistor 126 in response to radiation incident on the photodiode 130. A resistor 127 or other suitable impendence component electrically connects between the base terminal 132 of the transistor 126 and a power rail 129, which can be the same or different from the power rail 119.

A sampling capacitor 134 is electrically connected between the second node 128 and the ground 124 for sampling voltage accumulated in the integrating capacitor 122 when the sampling transistor 126 switches to electrically connect the integrating capacitor 122 to the sampling capacitor 134. An amplifier 136 is electrically connected to the second node 128 to amplify an electrical signal from the sampling capacitor 134 to the ROIC 116 (shown in FIG. 1). The amplifier 136 of each sensing pixel 110 of the array 102 (shown in FIG. 1) can be connected to output amplified electric signals to the ROIC 116 for data conditioning for output from the array 102. Each pixel 110 includes its own amplifier 136 A reset transistor 138, e.g., an nmos transistor, is electrically connected between the first node 120 and the ground 124 to switch electrical connectivity through the reset transistor 138 from the first node 120 to the ground 124 zero out the voltage of the integrating capacitor 122 in response to a reset signal from the controller 108 (shown in FIG. 1) received at a base terminal 140 of the reset transistor 138 to reset voltage of the integrating capacitor 122 to initiate integrating.

With reference again to FIG. 1, the read-out only integrated circuit (ROIC) 116 is operatively connected to the sensor array 102. The ROIC 116 includes a respective ROIC pixel (indicated schematically by the texture of ROIC 116 in FIG. 1) operatively connected to each passive imaging pixel 111 to receive electrical signals indicative of imaging data from the passive imaging pixel 111. The ROIC 116 also includes a respective ROIC pixel (indicated schematically by the texture of ROIC 116 in FIG. 1) operatively connected to each TOF imaging pixel 110 to receive electrical signals indicative of TOF from the TOF imaging pixel 110.

A support module 109, e.g. part of the controller 108, is operatively connected to the ROIC 116 to receive passive imaging and TOF imaging data from the ROIC 116, i.e. wherein the ROIC 116 conditions the raw values from the sensor array 102 and outputs the conditioned data to the support module 109. The support module 109 can be configured to output blended images including passive imaging data and TOF imaging data. The blended output can be a SWIR image overlaid on a TOF surface, for example. The support module 109 can be configured to separate passive imaging data and TOF imaging data from the ROIC 116 and to output separate images for passive imaging and TOF imaging.

A method of imaging includes collecting passive imaging data from a sensor array, e.g., sensor array 102, and collecting time of flight (TOF) imaging data from the sensor array. Collecting passive imaging data and collecting TOF imaging data can be performed at least partially at the same time and along a single optical axis A without parallax, given that the TOF imaging pixels and the passive imaging pixels 111 are interspersed on the same sensor array, e.g., sensor array 102.

Systems and methods as disclosed herein can allow for single sensor solutions in scenarios where structured light depth sensing is not sufficient, such as for long distance sensing or in a bright/outdoor environment. Additional advantages over conventional systems can include simultaneous passive and time of flight imaging with a single sensor, lower cost of camera electronics compared to receiving images from two separate sensors, and elimination of parallax error since the pixels can be co-located on the same focal plane array.

The methods and systems of the present disclosure, as described above and shown in the drawings, provide for TOF and passive imaging with superior properties including using a single sensor for both and accompanying savings in cost and complexity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of imaging comprising:
   collecting passive imaging data from a sensor array; and
   collecting time of flight (TOF) imaging data from the sensor array wherein collecting passive imaging data includes collecting passive imaging data on passive imaging pixels of the sensor array, and wherein collecting TOF imaging data includes collecting TOF imaging data on TOF pixels of the sensor array, wherein the passive imaging pixels are arranged in an alternating pattern with the TOF imaging pixels on the sensor array, wherein the alternating pattern includes alternating unbroken columns of a plurality of passive imaging pixels and unbroken columns of a plurality of TOF imaging pixels across the sensor array, wherein the passive imaging pixels each include a PIN photodiode, wherein the TOF imaging pixels each include an avalanche photodiode, wherein the passive imaging pixels and the TOF pixels are all sensitive to SWIR illumination.

2. The method as recited in claim 1, wherein collecting passive imaging data and collecting TOF imaging data are performed at least partially at e time and along a single optical axis without parallax.

3. The method as recited in claim 1, wherein each TOF pixel is configured to generate a pixel value that represents the distance between that TOF pixel and a point in a field of view.

4. The method as recited in claim 1, further comprising outputting blended images including passive imaging data and TOF imaging data.

5. The method as recited in claim 4, further comprising separating passive imaging data and TOF imaging data from a read only integrated circuit (ROIC), and outputting separate images for passive imaging and TOF imaging.

6. The system as recited in claim 1, further comprising initiating TOF imaging pixel integration and a pulse of illumination so TOF imaging pixels of the sensor array output a signal indicative to time of flight (TOF) of the pulse of illumination.

7. The method as recited in claim 6, further comprising flashing a scene with illumination from an illumination source and collecting passive imaging data from passive imaging pixels of the sensor array while flashing the scene with the illumination source.

8. The method as recited in claim 1, wherein the sensor array includes a plurality of time of flight (TOF) pixels and a plurality of passive imaging pixels, and further comprising generating a pixel value from each TOF pixel that represents the distance between that TOF pixel and a point in a field of view.

* * * * *